(12) United States Patent
Yee

(10) Patent No.: US 11,991,848 B2
(45) Date of Patent: May 21, 2024

(54) PROTECTIVE FILM AND METHOD FOR FABRICATING DISPLAY DEVICE

(71) Applicant: Samsung Display Co., LTD., Yongin-si (KR)

(72) Inventor: Dong Su Yee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 79 days.

(21) Appl. No.: 17/944,279

(22) Filed: Sep. 14, 2022

(65) Prior Publication Data

US 2023/0199989 A1 Jun. 22, 2023

(30) Foreign Application Priority Data

Dec. 16, 2021 (KR) .................. 10-2021-0180239

(51) Int. Cl.
*H05K 5/03* (2006.01)
*B32B 7/12* (2006.01)
*B32B 27/08* (2006.01)
*B32B 37/12* (2006.01)
*B32B 37/18* (2006.01)
(Continued)

(52) U.S. Cl.
CPC ................ *H05K 5/03* (2013.01); *B32B 7/12* (2013.01); *B32B 27/08* (2013.01); *B32B 37/12* (2013.01); *B32B 37/182* (2013.01); *B32B 37/26* (2013.01); *B32B 38/10* (2013.01); *B32B 2037/268* (2013.01); *B32B 2307/732* (2013.01); *B32B 2307/748* (2013.01); *B32B 2457/20* (2013.01)

(58) Field of Classification Search
CPC ......... B32B 3/14; B32B 3/16; B32B 2457/20; B32B 2457/202; B32B 2457/204; B32B 2457/206; B32B 2457/208; H05K 5/00; H05K 5/02; H05K 5/0217; H05K 5/0243; H05K 5/03
See application file for complete search history.

(56) References Cited

U.S. PATENT DOCUMENTS

2020/0227677 A1* 7/2020 Park ......................... B32B 7/06
2022/0381958 A1* 12/2022 Jeon ...................... G06F 1/1652

FOREIGN PATENT DOCUMENTS

JP        3188246          7/2001
KR    10-2020-0034862      4/2020
(Continued)

*Primary Examiner* — Zachary M Davis
(74) *Attorney, Agent, or Firm* — KILE PARK REED & HOUTTEMAN PLLC

(57) ABSTRACT

A protective film includes a panel protective film, a first protective film disposed on a surface of the panel protective film and covering the surface of the panel protective film, the first protective film having a surface and an opposite surface facing the panel protective film, and a second protective film disposed on an opposite surface of the panel protective film and covering the opposite surface of the panel protective film, the second protective film having a surface facing the panel protective film and an opposite surface opposed to the surface of the second protective film, wherein the first protective film includes a first film layer, a first adhesive layer disposed on the opposite surface of the first film layer, and a blocking layer disposed on an opposite surface of the first adhesive layer along an edge of the first adhesive layer.

20 Claims, 19 Drawing Sheets

(51) Int. Cl.
*B32B 37/26* (2006.01)
*B32B 38/10* (2006.01)

(56) References Cited

FOREIGN PATENT DOCUMENTS

| KR | 10-2020-0130579 | 11/2020 |
| KR | 10-2021-0025754 | 3/2021 |

* cited by examiner

PROTECTIVE FILM AND METHOD FOR FABRICATING DISPLAY DEVICE

CROSS REFERENCE TO RELATED APPLICATION

This application claims priority to and benefits of Korean Patent Application No. 10-2021-0180239 under 35 U.S.C. § 119, filed on Dec. 16, 2021, in the Korean Intellectual Property Office (KIPO), the entire contents of which are incorporated herein by reference.

BACKGROUND

1. Technical Field

The disclosure relates to a protective film, and a method for fabricating a display device.

2. Description of the Related Art

Glass articles are widely used in electronic devices including display devices or construction materials. For example, glass articles are employed as a substrate for a flat display device such as a liquid-crystal display (LCD), an organic light-emitting display (OLED) and an electrophoretic display (EPD), or a window for protecting it.

Previously, a colorless polyimide (CPI) film has been used for the cover window of a foldable display device. Recently, ultra-thin glass is attracting attention because it is scratch resistant and is able to be folded in two directions.

In order to protect the cover window from an external environment during a process of fabricating a display device, a protective film may be used to cover the cover window. The cover window can be protected by the protective film during certain processes.

SUMMARY

Aspects of the disclosure provide a protective film that may prevent external contaminants from adhering to a panel protective film, and a method for fabricating a display device.

Aspects of the disclosure also provide a protective film that may prevent contamination of a transport means for transporting the protective film by not exposing adhesive material to the transport means, and a method for fabricating a display device.

It should be noted that objects of the disclosure are not limited to the above-mentioned object; and other objects of the disclosure will be apparent to those skilled in the art from the following descriptions.

According to an embodiment of the disclosure, a protective film may comprise a panel protective film, a first protective film disposed on a surface of the panel protective film and covering the surface of the panel protective film, the first protective film having a surface and an opposite surface facing the panel protective film, and a second protective film disposed on an opposite surface of the panel protective film and covering the opposite surface of the panel protective film, the second protective film having a surface facing the panel protective film and an opposite surface opposed to the surface, wherein the first protective film may comprise a first film layer, a first adhesive layer disposed on the opposite surface of the first film layer, and a blocking layer disposed on an opposite surface of the first adhesive layer along an edge of the first adhesive layer, the second protective film may comprise a second film layer, and a second adhesive layer disposed on the surface of the second film layer, the blocking layer may be spaced apart from the panel protective film, and may be coplanar with the panel protective film, and the blocking layer may comprise a first region overlapping the second adhesive layer in a plan view and a second region located outside the first region and not overlapping the second adhesive layer in the plan view.

The first adhesive layer and the first film layer may completely overlap each other in a plan view, and the second adhesive layer and the second film layer may completely overlap each other in the plan view.

A width of the first protective film may be greater than a width of the panel protective film by about 3.6 mm to about 4.4 mm.

An outer side surface of the blocking layer may be aligned with an outer side surface of the first adhesive layer.

A width of the blocking layer may be in a range of about 1.8 mm to about 2.2 mm.

A thickness of the blocking layer may be in a range of about 25 μm to about 27 μm.

An inner side surface of the blocking layer may be disposed further to an outside than an outer side surface of the panel protective film and disposed further to an inside than an outer side surface of the second adhesive layer.

The blocking layer may comprise a third adhesive layer disposed on the first adhesive layer and a blocking pattern disposed on the third adhesive layer.

A thickness of the blocking pattern may be in a range of about 10 μm to about 20 μm.

A thickness of the third adhesive layer may be in a range of about 5 μm to about 7 μm.

The third adhesive layer may have an adhesive strength of about 100 gf/inch or more.

The third adhesive layer may include at least one of an acrylic adhesive, a silicone adhesive, and a urethane adhesive.

Each of the first protective film and the second protective film may be a stack selected from at least one of polyethylene terephthalate (PET), polycarbonate (PC), polyvinyl chloride (PVC), and polyolefin film.

A thickness of the panel protective film may be greater than a thickness of the blocking layer.

The thickness of the panel protective film may be in a range of about 25 μm to about 35 μm.

A thickness of the blocking layer may be in a range of about 25 μm to about 27 μm.

The blocking layer may comprise a third adhesive layer disposed on the first adhesive layer and a blocking pattern disposed on the third adhesive layer, and wherein the third adhesive layer has a thickness in a range of about 5 μm to about 7 μm.

A thickness of the first protective film may be substantially equal to a thickness of the second protective film.

The blocking layer may comprise segments separated from one another with an opening disposed between adjacent ones of the plurality of blocking segments.

According to yet another aspect of the disclosure, a method for fabricating a display device may comprise providing a protective film, providing a display panel, removing a second protective film of a protective film and placing the protective film such that an exposed panel protective film is placed on a surface of the display panel; and removing a first protective film, wherein the protective film may comprise the panel protective film, the first protective film disposed on a surface of the panel protective film and covering the surface of the panel protective film, the first protective film having a surface and an opposite surface facing the panel protective film; and the second protective film disposed on an opposite surface of the panel protective film and covering the opposite surface of the panel protective film, the second protective film having a surface facing the panel protective film and an opposite surface opposed to the surface of the second protective film, and the first protective film may comprise a first film layer, a first adhesive layer disposed on the opposite surface of the first film layer, and a blocking layer disposed on an opposite surface of the first adhesive layer along an edge of the first adhesive layer, the second protective film may comprise a second film layer, and a second adhesive layer disposed on a surface of the second film layer, and the blocking layer may be spaced apart from the panel protective film, and may be coplanar with the panel protective film, and the blocking layer may comprise a first region overlapping the second adhesive layer in a plan view, and a second region located outside the first region and not overlapping the second adhesive layer in the plan view.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
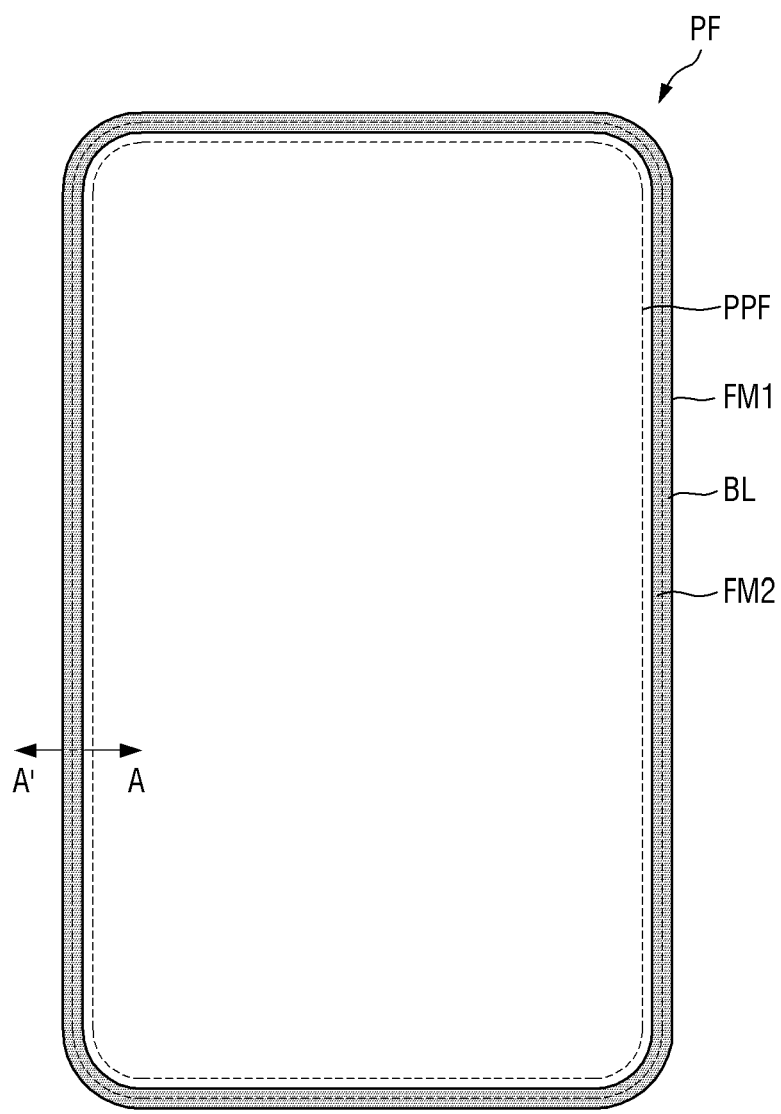
FIG. 1 is a schematic plan view of a protective film according to an embodiment of the disclosure.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that in case that a layer is referred to as being "on" another layer or substrate, it may be directly on the other layer or substrate, or intervening layers may also be present. The same reference numbers indicate the same components throughout the specification.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The term "overlap" or "at least partially overlap" as used herein may mean that at least part of a first object faces at least part of a second object in a given direction or given view.

The phrase "at least one of" is intended to include the meaning of "at least one selected from the group of" for the purpose of its meaning and interpretation. For example, "at least one of A and B" may be understood to mean "A, B, or A and B."

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described below with reference to the accompanying drawings.

Figure 2:
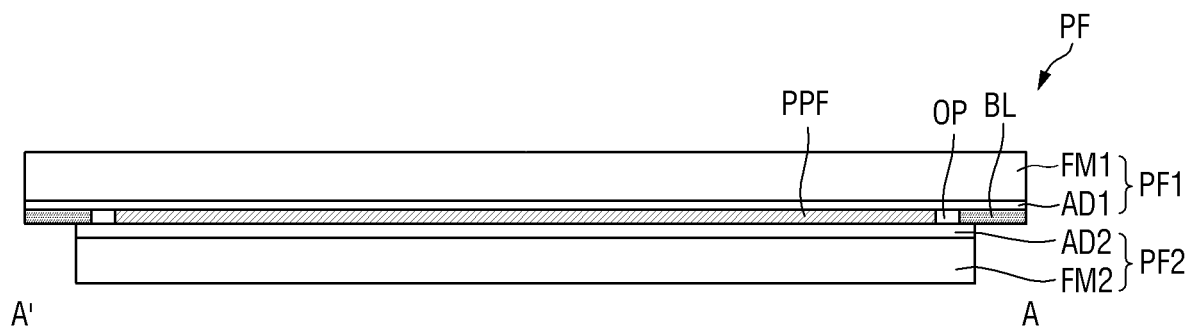
FIG. 2 is a schematic cross-sectional view of the protective film shown in FIG. 1.

FIG. 1 is a schematic plan view of a protective film according to an embodiment of the disclosure. FIG. 2 is a schematic cross-sectional view of the protective film shown in FIG. 1.

Referring to FIGS. 1 and 2, the protective film PF includes a panel protective film PPF, a first protective film PF1, a blocking layer BL, and a second protective film PF2.

The panel protective film PPF may overlap a display panel 300 (see FIG. 14) of the display device. A display panel protective film PPF may be attached above the display panel 300 to protect the display panel 300 and may transmit light emitted from the display panel.

The panel protective film PPF may be disposed to overlap the display panel and cover the entire surface of the display panel 300 (e.g., in a plan view). The panel protective film PPF has a shape similar to a shape of the display panel 300 in a plan view, but a size of the panel protective film PPF may be larger than a size of the display panel 300. For example, the panel protective film PPF may protrude outwards the display panel at shorter sides of the display device. Although the panel protective film PPF may protrude outwards the display panel also at longer sides of the display device, it may protrude more at the shorter sides than the longer sides. The panel protective film PPF may have a rectangular shape including the longer sides and the shorter sides similar to the shape of the display device in the plan view.

The panel protective film PPF may include a surface and an opposite surface opposed to the surface. In case that the panel protective film PPF is attached to the display device, the surface of the panel protective film PPF may be a surface facing the display panel, while the opposite surface may be a surface where images may be displayed.

The panel protective film PPF may be made of a transparent material. The panel protective film PPF may include, for example, glass or plastic. In case that the panel protective film PPF may include thin glass, the glass may be ultra-thin glass. The ultra-thin glass may have a thickness of about 30 μm or less or about 10 μm or less.

The panel protective film PPF may be blocked from the outside until it is attached to the display panel to prevent contamination. For example, protective films PF1 and PF2 may be disposed on a surface and the opposite surface of the panel protective film PPF.

The first protective film PF1 may be disposed on the surface of the panel protective film PPF, and the second protective film PF2 may be disposed on the opposite surface of the panel protective film PPF. The first protective film 100 and the second protective film 200 may be attached to the panel protective film PPF to protect sides of the panel protective film PPF while the panel protective film PPF is moved and loaded, and the first protective film 100 and the second protective film 200 may be delaminated and removed while the panel protective film PPF is mounted on the display panel or a touch member. A shape of the first protective film PF1 and the second protective film PF2 may be the same as the shape of the panel protective film PPF in a plan view.

The first protective film PF1 may include a first film layer FM1, a first adhesive layer AD1, and a blocking layer BL. The second protective film PF2 may include a second film layer FM2 and a second adhesive layer AD2.

The first film layer FM1 and the second film layer FM2 may cover (or overlap, e.g., in a plan view) the surface and the opposite surface of the panel protective film PPF, respectively, and each of the first film layer FM1 and the second film layer FM2 may include a cover portion overlapping the panel protective film PPF. Each of the first film layer FM1 and the second film layer FM2 may have the same shape or a similar shape with the shape of the panel protective film PPF and may be disposed to overlap the panel protective film PPF to substantially cover the panel protective film PPF.

In a plan view, the first protective film PF1 may be disposed on the panel protective film PPF to cover a surface of the panel protective film PPF, and the second protective film PF2 may be disposed on the panel protective film PPF to cover the opposite surface opposed to the surface of the panel protective film PPF. A more detailed description thereon will be described below.

Although the first film layer FM1 and the second film layer FM2 have the same shape as the shape of the panel protective film PPF in a plan view, each of the first film layer FM1 and the second film layer FM2 may further include a pull tab protruding outwards the panel protective film PPF in a plan view. The pull tab may allow a user to readily grip each of the first protective film PF1 and the second protective film PF2, so that the process of delaminating the protective films PF1 and PF2 may be quickly performed.

Each of the first film layer FM1 and the second film layer FM2 may be made of at least one of polyethylene terephthalate (PET), polyurethane (PU), polyimide (PI), polycarbonate (PC), polyethylene (PE), polypropylene (PP), polysulfone (PSF), polymethylmethacrylate (PMMA), triacetylcellulose (TAC), cycloolefin polymer (COP) and the like.

The first adhesive layer AD1 may be disposed on an opposite surface of the first film layer FM1 to bond (or adhere) the first film layer FM1 to a surface of the panel protective film PPF. For example, the first film layer FM1 may be attached to a surface of the panel protective film PPF through the first adhesive layer AD1.

The second adhesive layer AD2 may be disposed on a surface of the second film layer FM2 to couple (or connect) the second film layer FM2 with the opposite surface of the panel protective film PPF. For example, the second film layer FM2 may be attached to the opposite surface of the panel protective film PPF through the second adhesive layer AD2.

The adhesive strength or coupling strength between the first adhesive layer AD1 and the panel protective film PPF and between the second adhesive layer AD2 and the panel protective film PPF would be enough only if the first film layer FM1 and the second film layer FM2 are not separated off from the panel protective film PPF while it is stored or moved. In case that the panel protective film PPF is delaminated, it is desired that the first adhesive layer AD1 and the second adhesive layer AD2 are attached to the first film layer FM1 and the second film layer FM2, respectively, and the first adhesive layer 120 and the second adhesive layer 220 may not remain on the surface of the panel protective film PPF. In an embodiment, the coupling strength between the first adhesive layer AD1 and the panel protective film PPF and between the second adhesive layers AD2 and the panel protective film PPF may be smaller than the coupling strength between the first film layer FM1 and the first adhesive layer AD1 and between the second film layer FM2 and the second adhesive AD2.

The first adhesive layer AD1 and the second adhesive layer AD2 may be made of (or include) a low adhesive layer. For example, the first adhesive layer AD1 and the second adhesive layer AD2 may include acrylic, urethane, or silicone adhesive materials.

The blocking layer BL may be disposed on the opposite surface of the first adhesive layer AD1 along an edge of the first adhesive layer AD1. The blocking layer BL may be spaced apart from the panel protective film PPF, and may be coextensive with the panel protective film PPF on a same plane or may be coplanar with the panel protective film PPF. The blocking layer BL may include a region overlapping the second adhesive layer AD2 and a region positioned outside the region and not overlapping the second adhesive layer AD2. The blocking layer BL will be described in detail below.

The blocking layer BL may cover an adhesive surface of the first adhesive layer AD1 so that the adhesive material of the first adhesive layer AD1 at that position does not contact the panel protective film PPF, a tray and a surface of a stage during a fabricating process. In case that the first protective film PF1 and the second protective film PF2 are delaminated, some of the adhesive material of the first adhesive layer 120 and the second adhesive layer 220 attached to the surface of the panel protective film PPF, the tray and the surface of the stage during a fabricating process may remain. A surface of the panel protective film PPF contacting the blocking layer BL may not contact the adhesive material, and thus it is possible to prevent the adhesive material from remaining at that position.

Even though each of the first protective film PF1 and the second protective film PF2 is not coupled with the position where the blocking layer BL is disposed, it may be coupled (or connected or bonded) with the panel protective film PPF by the first adhesive layer AD1 and the second adhesive layer AD2 where the blocking layer BL is not disposed to be attached to the surfaces (or both surfaces) of the panel protective film PPF. In this manner, the first protective film PF1 and the second protective film PF2 may protect the surfaces of the panel protective film PPF before they are delaminated.

The blocking layer BL may be formed of (or include) a non-adhesive material. Accordingly, as described below, the second protective film PF2 may have a non-adhesive area. In another embodiment, the blocking layer BL may have a very low level of adhesive strength. Even so, the adhesive strength may be weaker than an adhesive strength of the second adhesive layer AD2 so that almost no adhesive material remains on the surface of the second adhesive layer AD2 in case that it is delaminated.

If the blocking layer BL occupies too large area on the first and second adhesive layers AD1 and AD2, the overall coupling strength (or adhesive strength) may become weak. As a result, the first protective film PF1 or the second protective film PF2 may be detached from the panel protective film PPF while it is stored or moved before a delamination process. Accordingly, the blocking layer BL may be selectively formed at positions where non-adhesiveness is required. An example of the arrangement of the blocking layer BL will be described below in detail.

Figure 3:
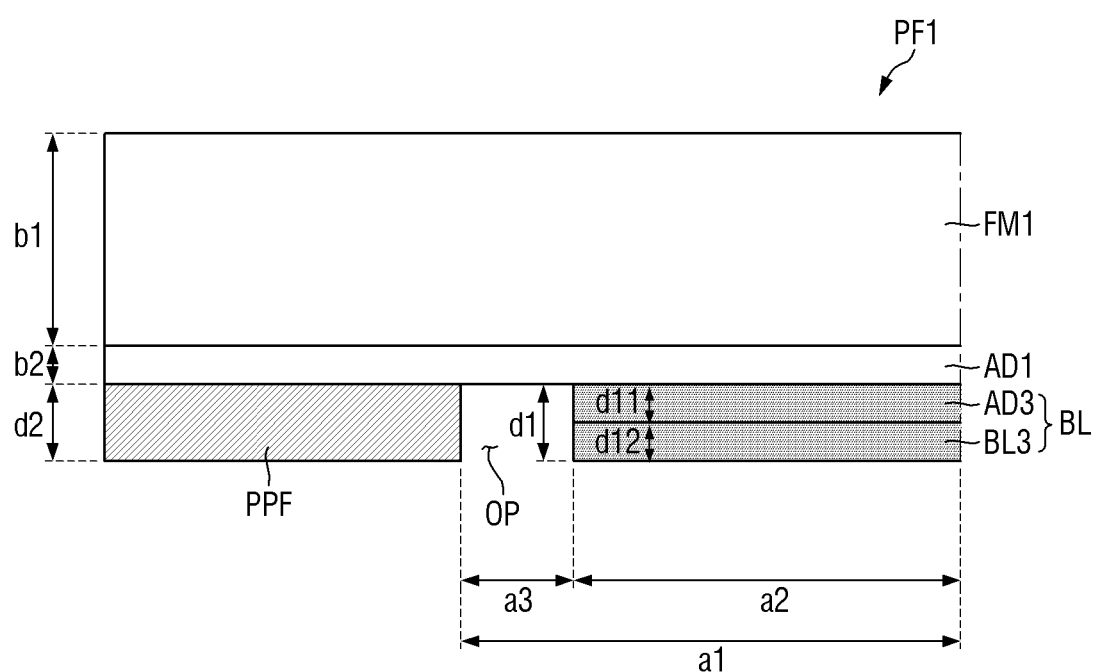
FIG. 3 is a schematic enlarged cross-sectional view of a part of the first protective film and the blocking layer according to an embodiment.
Figure 4:
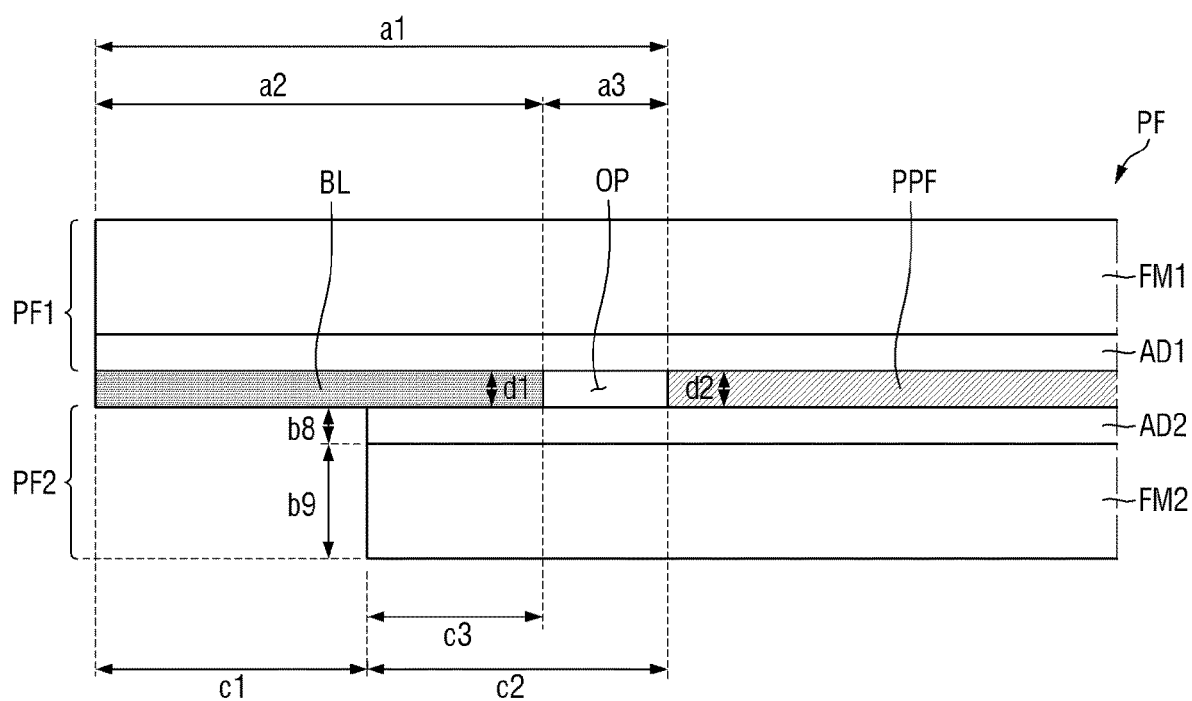
FIG. 4 is a schematic enlarged cross-sectional view taken along line A-A' shown in FIG. 1.

FIG. 3 is a schematic enlarged cross-sectional view of a part of the first protective film and the blocking layer according to an embodiment. FIG. 4 is a schematic enlarged cross-sectional view taken along line A-A' shown in FIG. 1.

Referring to FIGS. 3 and 4, the first film layer FM1 of the first protective film PF1 and the first adhesive layer AD1 disposed on the opposite surface of the first film layer FM1 may completely overlap each other. Accordingly, an outer side surface of the first adhesive layer AD1 may be aligned with an outer side surface of the first film layer FM1.

The first protective film PF1 may be disposed on the panel protective film PPF to cover a surface of the panel protective film PPF. For example, the outer side surface of the first protective film PF1 may be disposed further outwards by a first width a1 than the outer side surface of the panel protective film PPF to completely cover the surface of the panel protective film PPF.

A thickness of the first protective film PF1 may be greater than a thickness of the panel protective film PPF. For example, the first film layer FM1 of the first protective film PF1 may have a first thickness b1, and the first thickness b1 may range from about 80 μm to about 120 μm. In addition, the first adhesive layer AD1 of the first protective film PF1 may have a second thickness b2, and the second thickness b2 may range from about 25 μm to about 35 μm. The panel protective film PPF may have a third thickness d2. The third thickness d2 may be about 10 μm or less, about 25 μm to about 35 μm, or about 35 μm to about 45 μm. It should be understood, however, that the disclosure is not limited thereto. The first protective film PF1 may have different thicknesses depending on the thickness of the panel protective film PPF.

The blocking layer BL disposed on the first adhesive layer AD1 may include a third adhesive layer AD3 and a blocking pattern BL3.

The outer side surface of the blocking layer BL may be aligned with the outer side surface of the first adhesive layer AD1. For example, in case that the blocking layer BL has a second width a2, the blocking layer BL may be disposed along the edge of the first adhesive layer AD1 on the outer side surface of the first film layer FM1 by the second width a2 of the blocking layer BL. For example, the second width a2 may range from about 1.8 μm to about 2.2 μm. This is because there may be an error during a process of attaching the panel protective film PPF to the first protective film PF1, and thus a margin of a third width a3 of an opening OP may be required. There may be an error during the process of attaching the second protective film PF2 to the blocking layer BL, and thus the margin of the second width a2 of the blocking layer BL may be required. If the second width a2 is smaller than about 1.8 μm, the second protective film PF2 and the blocking layer BL may be delaminated. If the second width a2 is larger than about 2.2 μm, the panel protective film PPF may overlap the blocking layer BL in case that it is attached on the first protective film PF1.

The blocking layer BL may be spaced apart from the panel protective film PPF and may be coextensive with the panel protective film PPF. For example, the blocking layer BL may be coextensive with the panel protective film PPF on a same plane. An inner side surface of the blocking layer BL may be disposed outside an outer side surface of the panel protective film PPF and disposed inside an outer side surface of the second adhesive layer AD2. For example, in case that the blocking layer BL has the second width a2 in the first width a1 from the outside of the first protective film PF1 to the outside of the panel protective film PPF, they may be spaced apart from each other by the third width a3 equal to the difference between the first width a1 and the second width a2, to form the opening OP.

Accordingly, the blocking layer BL having the second side a2 may be disposed from the outer side surface of the first protective film PF1 that is disposed further to the outer side than the outer side surface of the panel protective film PPF by the first width a1, so that the third width a3 may be formed between the outer side surface of the panel protective film PPF and the inner side surface of the blocking layer BL. This allows the protective film PF to be stably attached within the error margin during a process of attaching the protective films PF. It should be understood, however, that the disclosure is not limited thereto. Due to a process error, the outer side surface of the blocking layer BL may be located outside the outer side surface of the first film layer FM1. Even in this instance, the protective film PF may be stably attached within the error margin of the third width a3.

An outer side surface of the third adhesive layer AD3 may be aligned with the outer side surface of the blocking pattern BL3. The third adhesive layer AD3 may have a third adhesive strength to attach the first adhesive layer with the blocking pattern BL3. For example, the third adhesive strength must be greater than or equal to the minimum adhesive strength so that the blocking pattern BL3 may remain attached to the first protective film PF1 in case that the first protective film PF1 and the second protective film PF2 are delaminated. It may be about 100 gf/inch or more.

A thickness of the blocking layer BL may be smaller than a thickness of the panel protective film PPF. For example, the third adhesive layer AD3 of the blocking layer BL may have a fourth thickness d11, and the fourth thickness d11 may have a thickness of about 5 µm to about 7 µm. The blocking pattern BL3 of the blocking layer BL may have a fifth thickness d12, and the fifth thickness d1 about 2 may be about 10 µm to about 20 µm, or about 25 µm to about 27 µm. The third thickness d2 of the panel protective film PPF may be about 10 µm or less, about 25 µm to about 35 µm, or about 35 µm to about 45 µm as described above. Accordingly, the thickness d1 of the blocking layer BL may be smaller than the thickness of the panel protective film PPF, and thus the first protection film PF1 and the second protection film PF2 come into contact through the blocking layer BL. Accordingly, it is possible to prevent contaminants from adhering to the panel protective film PPF.

The second film layer FM2 of the second protective film PF2 and the second adhesive layer AD2 disposed on the opposite surface of the second film layer FM2 may completely overlap each other. Accordingly, the outer side surface of the second adhesive layer AD2 may be aligned with the outer side surface of the second film layer FM2.

The second protective film PF2 may be disposed on the panel protective film PPF to cover the opposite surface of the panel protective film PPF that is opposed to the surface of the panel protective film PPF. For example, the outer side surface of the second protective film PF1 may be disposed further outwards by a fourth width c2 than the outer side surface of the panel protective film PPF to completely cover the opposite surface of the panel protective film PPF.

The outer side surface of the second protective film PF2 may be located inside the outer side surface of the first adhesive layer AD1 of the first protective film PF1. For example, it may have a fifth width c1 from the outer side of the first protective film PF1 to the outer side of the second protective film PF2. Accordingly, the outer side surface of the second adhesive layer AD2 may be located further to the outside than the inner side surface of the blocking layer BL. For example, it may have a sixth width c3 that the blocking layer BL and the second adhesive layer AD2 overlap each other. The sixth width c3 may be determined according to a difference between the width of the blocking layer BL and the width of the second adhesive layer AD2. For example, the blocking layer BL may include a first region overlapping the second adhesive layer AD2 and a second region positioned outside the first region and not overlapping the second adhesive layer AD2. The inner side surface of the blocking layer BL may be located further to the inside than the outer side surface of the second adhesive layer AD2 to form the opening OP.

Accordingly, the blocking layer BL having the second width a2 may be disposed from the outer side surface of the first protective film PF1 that may be further disposed outwards than the outer side surface of the panel protective film PPF by the first width a1, and the second adhesive layer AD2 overlaps the blocking layer BL by the sixth width c3, such that the opening OP having the third width a3 may be formed between the outer side of the panel protective film PPF and the inner side surface of the blocking layer BL. The opening OP may be surrounded by the outer side surface(s) of the second adhesive layer AD2, the first adhesive layer AD1, the blocking layer BL and the panel protective film PPF. Therefore, in case that the first protective film PF1 and the second protective film PF2 are attached on the panel protective film PPF, even if there is an error in a fabricating process, the protective film PF may be stably attached within the error margin of the third width a3.

The second protective film PF2 may have the same thickness as the first protective film PF1. For example, the first film layer FM1 and the second film layer FM2 may have the same thickness, and the first adhesive layer AD1 and the second adhesive layer AD2 may have the same thickness. For example, each of the first film layer FM1 and the second protective film layer FM2 may have a first thickness b1, and each of the first adhesive layer AD1 and the second adhesive layer AD2 may have a second thickness b2. The first film layer FM1 and the second film layer FM2 may have different thicknesses from each other. The panel protective film PPF may have a third thickness d2 smaller than the first thickness b1.

A first adhesive strength between the panel protective film PPF and a first adhesive layer AD1 may be greater than a second adhesive strength between the panel protective film PPF and the second adhesive layer AD2. Accordingly, an adhesive strength between the panel protective film PPF and the first film layer FM1 may be greater than an adhesive strength between the panel protective film PPF and the second film layer FM2. Accordingly, in case that the protective film PF are delaminated, the second film layer FM2 may be delaminated first, as described below.

The third adhesive strength of the third adhesive layer AD3 between the first adhesive layer AD1 and the blocking pattern BL3 may be greater than the fourth adhesive strength between the blocking pattern BL3 and the second adhesive layer AD2. Accordingly, in case that the second protective film PF is first delaminated as described below, the blocking layer BL may remain on the first adhesive layer AD1 and may be attached to the first protective film PF1. In case that the first protective film PF1 is delaminated, it may be delaminated together with the first protective film PF1.

Figure 5:
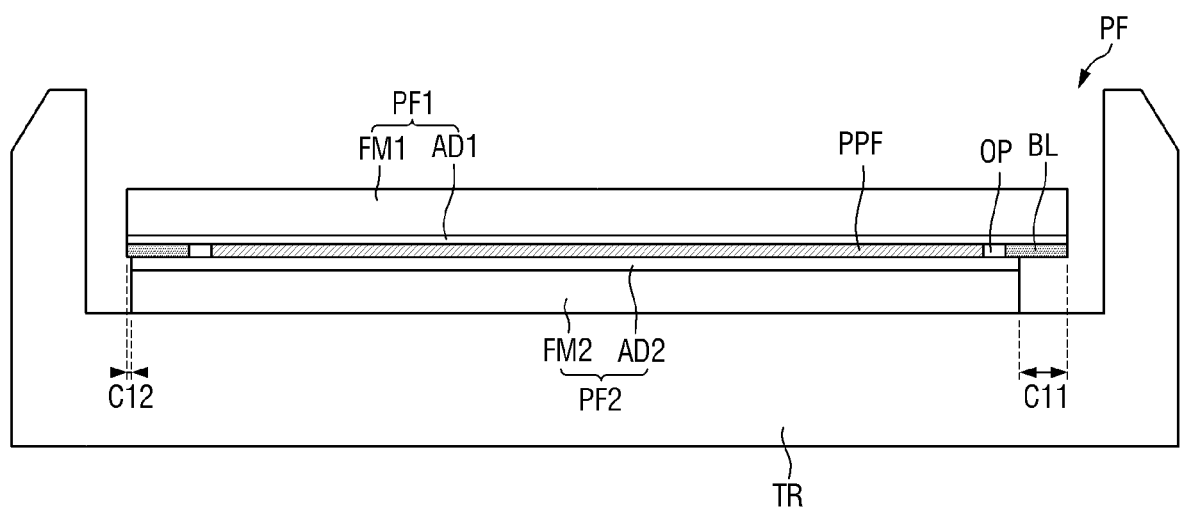
FIGS. 5 and 6 are schematic cross-sectional views showing protective films attached to the panel protective film according to an embodiment.
Figure 6:
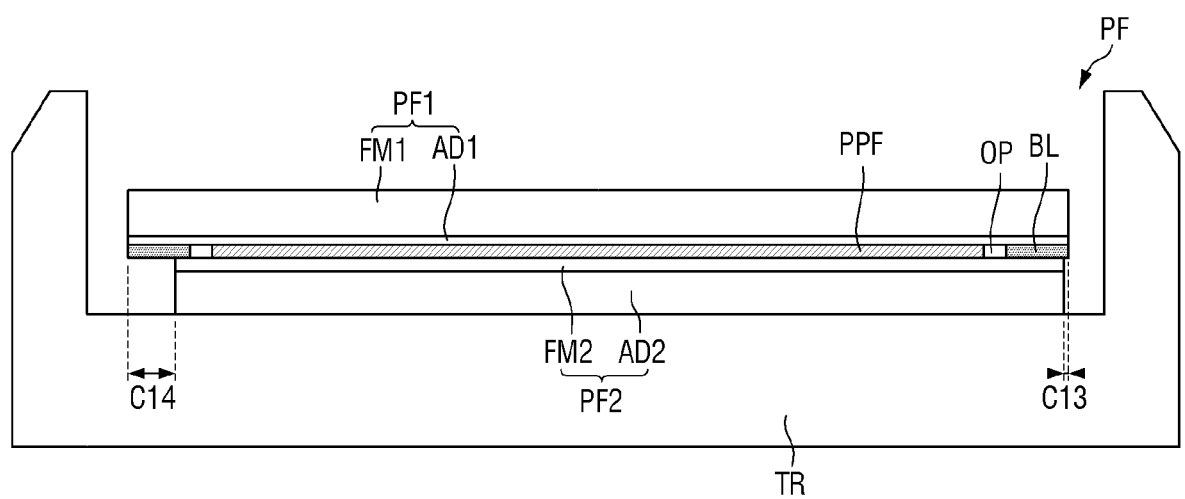

FIGS. 5 and 6 are schematic cross-sectional views showing protective films attached to the panel protective film according to an embodiment.

Referring to FIGS. 5 and 6, in case that the first protective film PF1 and the second protective film PF2 are attached on a surface and the opposite surface of the panel protective film PPF, respectively, there may be an error in the locations where the first protective film PF1 and the second protective film PF2 are attached. For example, as shown in the schematic cross-sectional view of FIG. 5, the second protective film PF2 may be attached to the left side relative to the first protective film PF1 and the panel protective film PPF. Accordingly, the distance between the outer side of the first protective film PF1 and the outer side of the second protective film PF2 on a side may be different from that on the opposite side. In another example, as shown in the schematic cross-sectional view of FIG. 6, the second protective film PF2 may be attached to the right side relative to the first protective film PF1 and the panel protective film PPF. Accordingly, the distance between the outer side of the first protective film PF1 and the outer side of the second protective film PF2 on a side may be different from that on the opposite side.

In case that the protective film PF is transported by a tray TR, even if a distance between the outer side of the first protective film PF1 and the outer side of the second protective film PF2 on a side is different from that on the opposite side, it is possible to prevent external contaminants from being attached to the panel protective film PPF within the margin of the third width a3 of the opening OP formed with the blocking layer BL having the second width a2 and the second protective film PF2 overlapping the blocking layer BL by the sixth width c3.

The first protective film PF1 overlaps the blocking layer BL by the second width a2 and the second protective film PF2 overlaps the blocking layer BL by the sixth width c3, so that the first adhesive layer AD1 and the second adhesive layer AD2 are not exposed to the outside. As a result, the tray TR may be not exposed to the adhesive materials, and thus it is possible to prevent the tray TR that transports the protective film PF from being contaminated.

It is possible to prevent damage to the panel protective film PPF from the outside by virtue of the blocking layer BL on the outside of the panel protective film PPF, and it is possible to prevent residual contaminants.

FIGS. 7 to 10 are schematic cross-sectional views showing processing steps of a method for fabricating a protective film according to an embodiment of the disclosure.

Referring to FIGS. 7 to 11, a method for fabricating a protective film PF will be described below, in which a first protective film PF1 and a second protective film PF2 may be attached on the panel protective film PPF.

Figure 7:
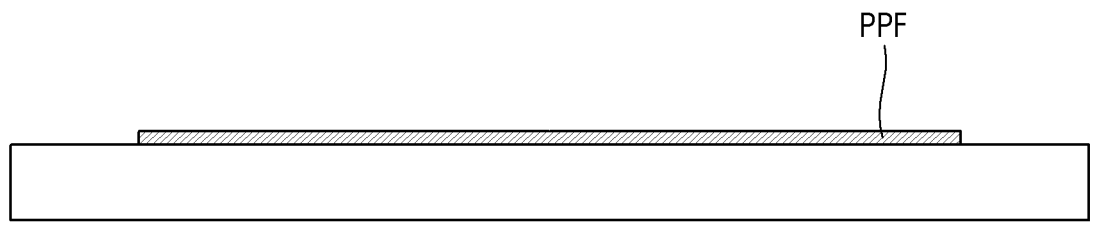
FIGS. 7 to 10 are schematic cross-sectional views showing processing steps of a method for fabricating a protective film according to an embodiment of the disclosure.

Initially, referring to FIG. 7, a panel protective film may be prepared on a stage.

As described above, the panel protective film PPF may be attached on a cover window on a display panel or a touch panel of a display device. Since some contaminants may remain on the surface of the panel protective film PPF, a panel protective film PPF may be prepared on the stage so that a first protective film PF1 and a second protective film PF2 may be attached to a surface and/or an opposite surface of the panel protective film PPF.

Figure 8:
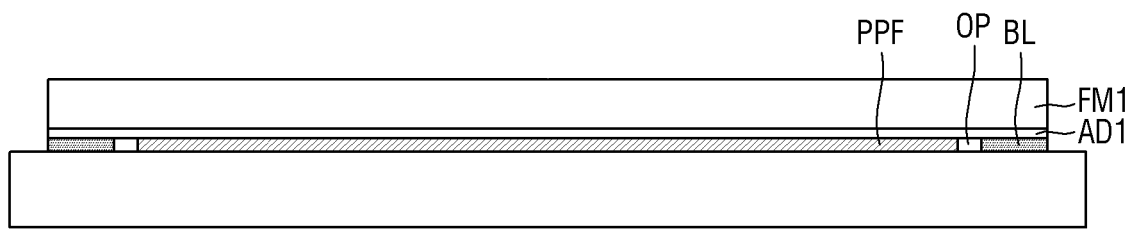

Subsequently, referring to FIG. 8, the first protective film PF1 including the blocking layer BL may be attached to a surface of the panel protective film PPF.

A first protective film PF1 is prepared, which may include a first film layer FM1 of the first protective film PF1, a first adhesive layer AD1 attached on the first film layer FM1, and a blocking layer BL adhered to a partial area on the first adhesive layer AD1. As described above, the first film layer FM1 and the first adhesive layer AD1 of the first protective film PF1 may completely overlap each other, and the blocking layer BL may be disposed along the edge of the first adhesive layer AD1 on the opposite surface of the first adhesive layer AD1.

The first protective film PF1 may be attached to a surface of the panel protective film PPF. The area of the first protective film PF1 may be larger than an area of the panel protective film PPF in a plan view. For example, an entire area of the panel protective film PPF may overlap an area of the first protective film PF1, and the blocking layer BL of the first protective film PF1 may be attached on the stage so that it covers the outer side surface of the panel protective film PPF.

Accordingly, the entire area of the panel protective film PPF may be attached to have a first adhesive strength with the first adhesive layer AD1 of the first protective film PF1, and the blocking layer BL may be attached to have a third adhesive strength with the first adhesive layer AD1. The blocking layer BL of the first protective film PF1 may be disposed on the stage to form an opening OP with the panel protective film PPF. Accordingly, the panel protective film PPF may be blocked from external foreign substances, and the stage and the first adhesive layer AD1 may be not directly attached because of the blocking layer BL, so that the adhesive material of the first adhesive layer AD1 would not remain on the stage.

Figure 9:
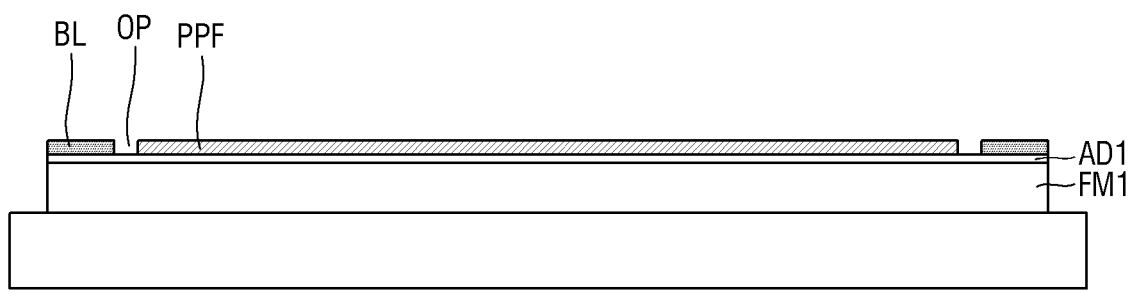

Subsequently, referring to FIG. 9, in order to attach the second protective film PF2, the opposite surface of the panel protective film PPF adhered to the first protective film PF1 may be placed on the stage.

Figure 10:
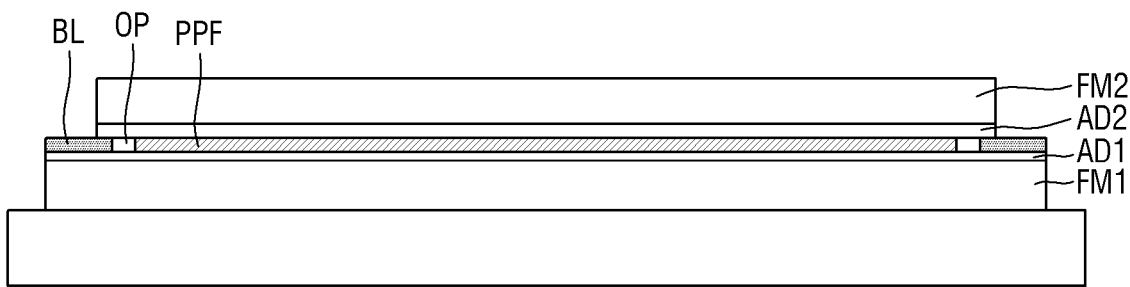

Lastly, referring to FIG. 10, the second protective film PF2 may be attached to the opposite surface of the panel protective film PPF.

The second protective film PF2 may be attached to the opposite surface of the panel protective film PPF. The second protective film PF2 may include a second film layer FM2 and a second adhesive layer AD2 attached on the second film layer FM2.

The area of the second protective film PF2 may be larger than an area of the panel protective film PPF in a plan view. For example, the entire area of the panel protective film PPF may overlap the second protective film PF2, and the entire area of the opposite surface of the panel protective film PPF may overlap the second adhesive layer AD2 of the second protective film PF2. The outer side surface of the second protective film PF2 may be located more to the inside than the outer side surface of the first adhesive layer AD1 of the first protective film PF1. For example, it may have a fifth width c1 from the outer side of the first protective film PF1 to the outer side of the second protective film PF2.

Accordingly, the first protective film PF1 and the second protective film PF2 may be provided and attached to the surfaces of the panel protective film PPF. The surface of the panel protective film PPF may be covered by the first adhesive layer AD1 of the first protective film PF1, the opposite surface of the panel protective film PPF may be covered by the second adhesive layer AD2 of the second protective film PF2, and the outer side surface of the panel protective film PPF may be spaced apart from the outer side surface of the blocking layer BL by the third width a3$ff$ covered by it, such that it may be sealed from the outside. Accordingly, the panel protective film PPF may be protected from external contaminants. The adhesive material of the first adhesive layer AD1 and the second adhesive layer AD2 may not remain on the stage, so that it is possible to prevent residual contaminants because of the adhesive material in the process.

Figure 11:
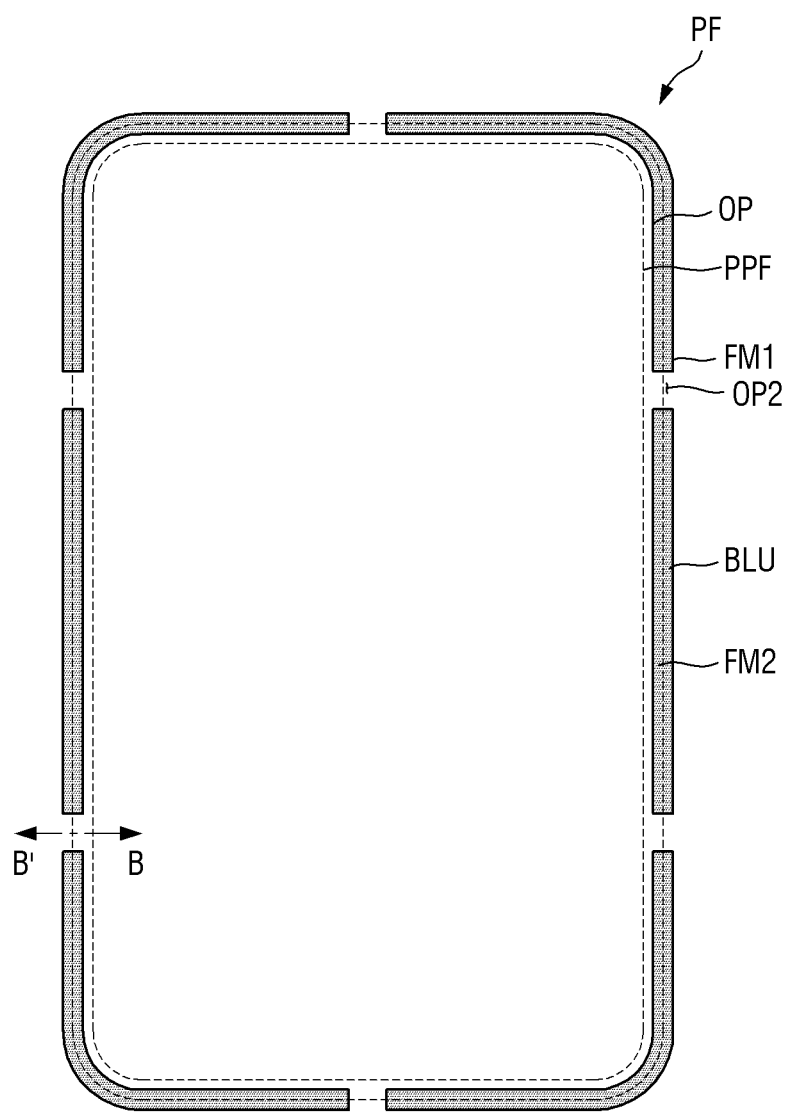
FIG. 11 is a schematic plan view of a protective film according to an embodiment of the disclosure.
Figure 12:
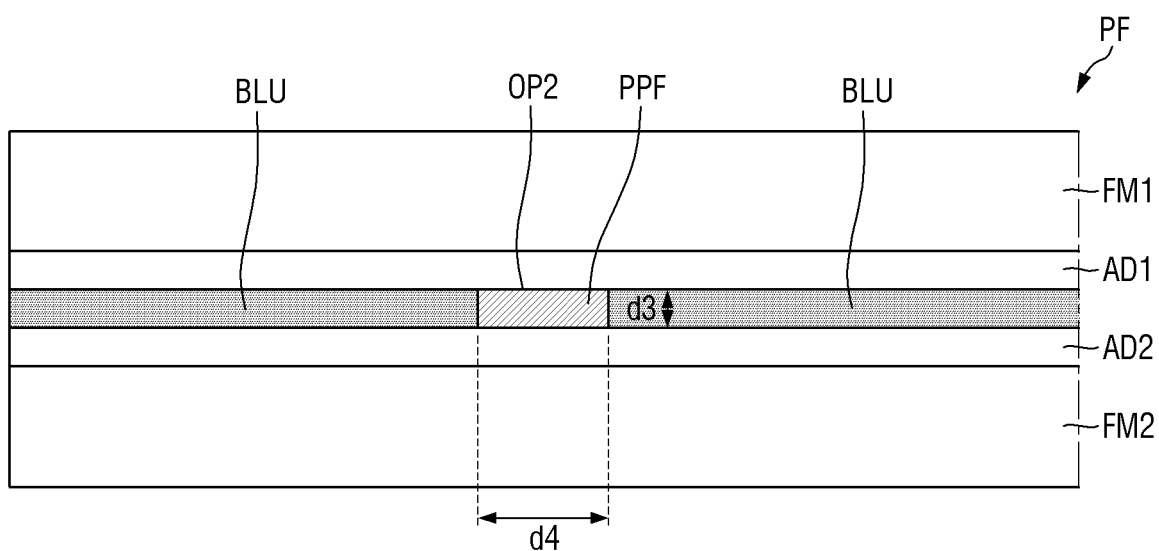
FIG. 12 is a schematic view showing a side of a protective film according to an embodiment of the disclosure.
Figure 13:
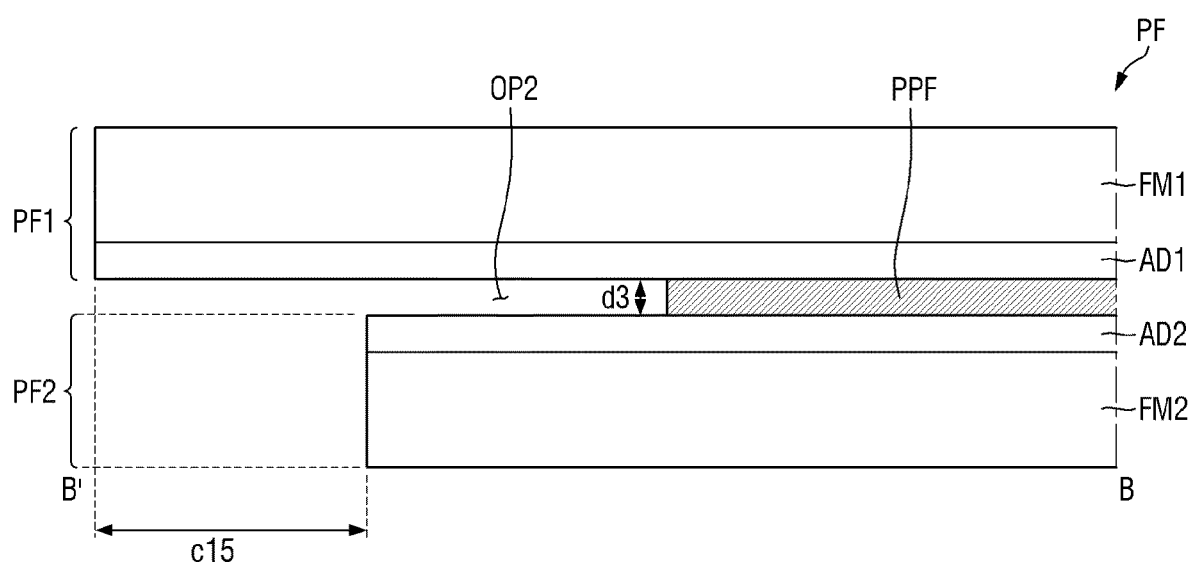
FIG. 13 is a schematic cross-sectional view of a protective film taken along line B-B' shown in FIG. 11 according to an embodiment of the disclosure.

FIG. 11 is a schematic plan view of a protective film according to an embodiment of the disclosure. FIG. 12 is a view showing a side of a protective film according to an embodiment of the disclosure. FIG. 13 is a schematic cross-sectional view of a protective film taken along line B-B' shown in FIG. 11 according to an embodiment of the disclosure.

The embodiment of FIGS. 11 to 13 may be different from the embodiment of FIGS. 1 to 6 at least in that a first protective film PF1 may include blocking layer units BLU in which blocking layers BL and blocking layer openings OP2 may be separated in a plan view.

Adjacent ones of the blocking layer units BLU may be spaced apart from each other by a distance. The surface of the first adhesive layer AD1 may be exposed through the space, and the outer side surface of the panel protective film PPF may be exposed. If the space between them is wide, the blocking effect of the first adhesive layer AD1 and the second adhesive layer AD2 may be reduced. Accordingly, by disposing them closer, the blocking effect may be maintained substantially. For example, in case that the protective film PF is disposed on the tray TR, the exposed surfaces of the first and second adhesive layers AD1 and AD2 may not contact the tray TR because of the blocking layer units BLU. Accordingly, it is possible to block or reduce the residual adhesive material on the tray TR.

The blocking layer units BLU may be arranged in a column or in columns. Although the blocking layer units BLU have a rectangular shape in the drawings, the blocking layer units BLU may be modified into a variety of shapes.

The blocking layer unit BLU having the second width a2 may be disposed from the outer side surface of the first protective film PF1 that is further disposed outwards than the outer side surface of the panel protective film PPF by the first width a1, and the second adhesive layer AD2 may overlap the blocking layer unit BLU by the sixth width c3, such that the opening OP having the third width a3 may be formed between the outer side of the panel protective film PPF and the inner side surface of the blocking layer unit BLU. The opening OP may be surrounded by the outer side surface of the second adhesive layer AD2, the first adhesive layer AD1, the blocking layer BL and the panel protective film PPF in a plan view. However, the outer side surface of the opening OP may contact the outside through the blocking layer opening OP2. Accordingly, air bubbles remaining in the opening OP may be released through the blocking layer opening OP2 during the process of fabricating the protective film PF.

Figure 14:
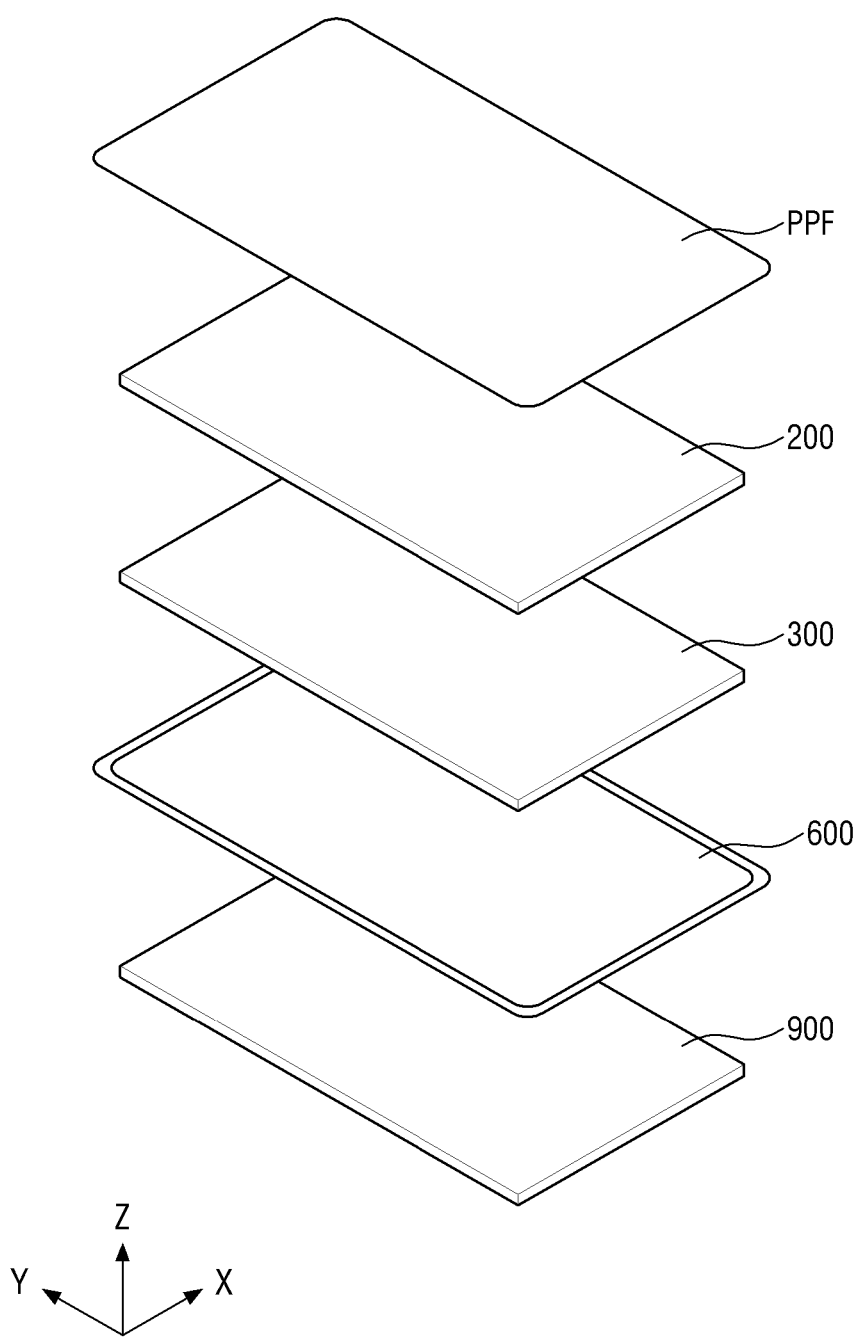
FIG. 14 is an exploded, schematic perspective view of a display device including a protective film according to an embodiment of the disclosure.

FIG. 14 is an exploded, schematic perspective view of a display device including a protective film according to an embodiment of the disclosure.

Referring to FIG. 14, a display device 10 according to an embodiment may include a panel protective film PPF, a touch sensing device 200, a display panel 300, a middle frame 600 and a bottom cover 900.

One of the protective films PF described above with reference to FIGS. 1 to 13 may be disposed as the panel protective film PPF. In the process of assembling the panel protective film PPF, the touch sensing device 200, the display panel 300, the middle frame 600 and the bottom cover 900, the first film layer FM1 and the second film layer FM2 may be removed.

The panel protective film PPF may be disposed to cover the touch sensing device 200 and the display area of the display panel 300 to protect the touch sensing device 200 and the display panel 300 from the outside.

The touch sensing device 200 may be disposed between the panel protective film PPF and the display panel 300. The touch sensing device 200 may be disposed in line with a transmitting portion of the panel protective film PPF. It should be understood, however, that the disclosure is not limited thereto. The touch sensing device 200 may be disposed on the transmitting portion and a part of a blocking portion of the panel protective film PPF. In this instance, the touch may be sensed even in the blocking portion.

The touch sensing device 200 may be attached to the lower surface of the panel protective film PPF through an adhesive layer. A polarizing film may be added on the touch sensing device 200 to avoid the visibility from decreasing due to reflection of external light. In this instance, the polarizing film may be attached to the lower surface of the panel protective film PPF through the first adhesive member 910.

The touch sensing device 200 may be an element for sensing a user's touch position. The touch sensing device 200 may be implemented as a capacitive touch sensing device of a self-capacitance type or a mutual capacitance type. In case that the touch sensing device 200 is of a self-capacitance type, the touch sensing device 200 may include only the touch driving electrodes. In another example, in case that the touch sensing device 200 is of a mutual capacitance type, the touch sensing device 200 may include touch driving electrodes and touch sensing electrodes. In the following description, the mutual capacitive touch sensing device will be described as an example.

The touch sensing device 200 may be in the form of panel or film. In this instance, the touch sensing device 200 may be attached on the thin-film encapsulation film of the display panel 300 through the adhesive layer. The adhesive layer may be an optically clear adhesive film (OCA) or an optically clear adhesive resin (OCR).

In another example, the touch sensing device 200 may be formed integrally with the display panel 300. The touch driving electrodes and the touch sensing electrodes of the touch sensing device 200 may be disposed on the thin-film encapsulation layer of the display panel 300.

The display panel 300 may be disposed under the touch sensing device 200. The display panel 300 may be disposed to overlap the transmitting portion of the panel protective film PPF. The display panel 300 may be a light-emitting display panel including light-emitting elements. For example, the display panel 300 may include an organic light-emitting display panel using organic light-emitting diodes, a micro light-emitting diode display panel using micro LEDs, and a quantum-dot light-emitting display panel including quantum-dot light-emitting diodes.

The display panel 300 may include a substrate, a thin-film transistor layer disposed on the substrate, a light-emitting element layer, and a thin-film encapsulation layer.

Since the display panel 300 is flexible, it may be formed of plastic. The substrate may include a flexible substrate and a support substrate. Because the support substrate supports the flexible substrate, it may be less flexible. Each of the flexible substrate and the support substrate may include a flexible polymer material. For example, each of the flexible substrate and the support substrate may be polyethersulphone (PES), polyacrylate (PA), polyacrylate (PAR), polyetherimide (PEI), polyethylenenaphthalate (PEN), polyethyleneterephthalate (PET), polyphenylenesulfide (PPS), polyallylate, polyimide (PI), polycarbonate (PC), cellulosetriacetate (CAT), cellulose acetate propionate (CAP), or combinations thereof.

A thin-film transistor layer may be disposed on the substrate. The thin-film transistor layer may include scan lines, data lines, and thin-film transistors. Each of the thin-film transistors may include a gate electrode, a semiconductor layer, and source and drain electrodes. In case that a scan driver is formed directly on the substrate, it may be formed together with the thin-film transistor layer.

The light-emitting element layer may be disposed on the thin-film transistor layer. The light-emitting element layer may include an anode electrode(s), an emissive layer, a cathode electrode(s), and banks. The emissive layer may include an organic emissive layer containing an organic material. For example, the emissive layer may include a hole injection layer, a hole transporting layer, an organic light-emitting layer, an electron transporting layer, and an electron injection layer. The hole injection layer and the electron injection layer may be eliminated. In case that a voltage is applied to the anode electrode and the cathode electrode, the holes and electrons may move to the organic emissive layer through the hole transporting layer and the electron transporting layer, respectively, such that they combine internal organic emissive layer to emit light. The light-emitting element layer may be a pixel array layer where pixels are formed. Accordingly, the region where the light-emitting element layer is formed may be defined as a display area for displaying images. The peripheral area of the display area may be defined as a non-display area.

A thin encapsulation layer may be disposed on the light-emitting element layer. The thin encapsulation layer may serve to prevent permeation of oxygen or moisture into the light-emitting element layer. The thin encapsulation layer may include at least one inorganic layer and at least one organic layer.

The middle frame 600 may be disposed under the display panel 300. The middle frame 600 may include a bottom portion, and side portions bent at the ends of the bottom portion.

The bottom cover 900 may be disposed under the middle frame 600. The bottom cover 900 may be fastened and fixed to the middle frame 600. The bottom cover 900 may form an exterior of the lower surface of the display device 10. The bottom cover 900 may include (or may be made of) plastic and/or metal.

Hereinafter, a method for fabricating a display device using a window member including the above-described protective film PF will be described below.

FIGS. 15 to 19 are schematic cross-sectional views showing processing steps of a method of fabricating a display device according to an embodiment of the disclosure.

Figure 15:
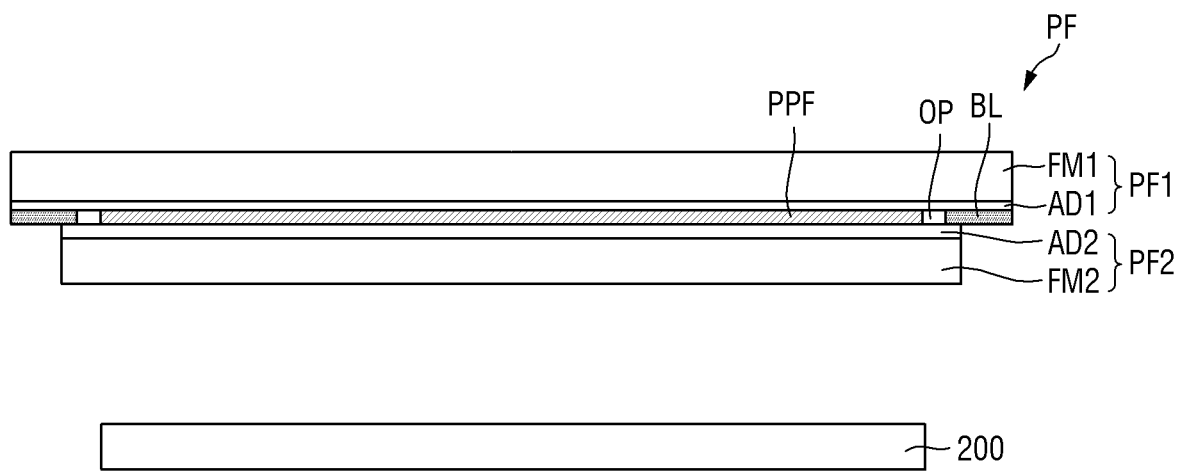
FIGS. 15 to 19 are schematic cross-sectional views showing processing steps of a method of fabricating a display device according to an embodiment of the disclosure.

Referring to FIG. 15, a protective film PF may be prepared, in which a first protective film PF1 including a blocking layer BL and a second protective film PF2 may be attached on a surface and the opposite surface of the panel protective film PPF.

The preparing the protective film PF may include preparing the protective film PF including the first protective film PF1 including the blocking layer BL and the second protective film PF2, and attaching the first and second protective films PF1 and PF2 to a surface and the opposite surface of the panel protective film PPF, respectively.

The first protective film PF1 and the second protective film PF2 may be produced by preparing a protective film in which an adhesive layer may be formed, and curing a UV curable ink on the adhesive layer by screen printing, inkjet printing, gravure printing, offset printing or the like, to form the blocking layer BL.

Figure 16:
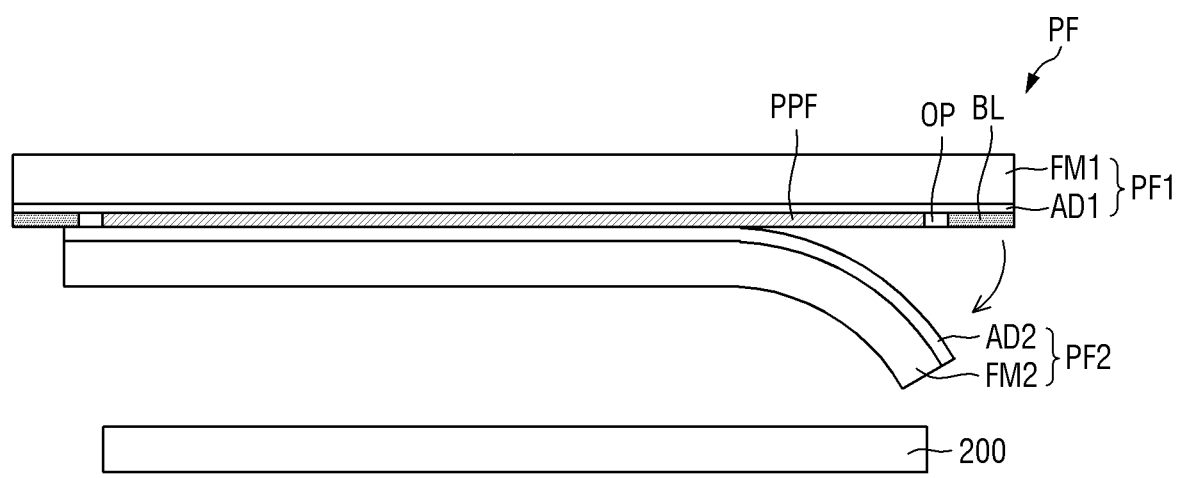

Subsequently, referring to FIG. 16, the second protective film PF2 of the panel protective film PPF may be delaminated. By delaminating the second protective film PF2, the surface of the panel protective film PPF may be exposed. Although some adhesive material may remain on the surface of the panel protective film PPF, the adhesive material may not remain at the position where the blocking layer BL is formed.

Figure 17:
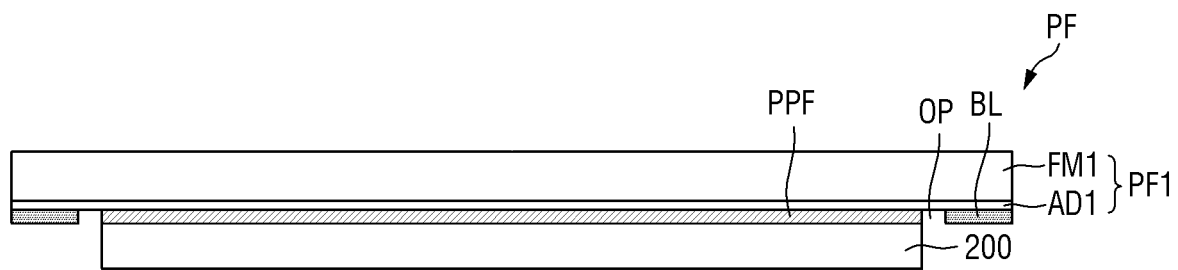

Subsequently, referring to FIG. 17, the display panel 300 may be attached on a surface of the panel protective film PPF. The display panel 300 may be attached on a surface of the panel protective film PPF through a light-transmitting adhesive or resin. Another panel such as the touch sensing device 200 or an optical film such as a polarizing film may be interposed between the display panel 300 and the panel protective film PPF. Various structures and fabricating methods related thereto are well known in the art and thus are not described in detail.

Figure 18:
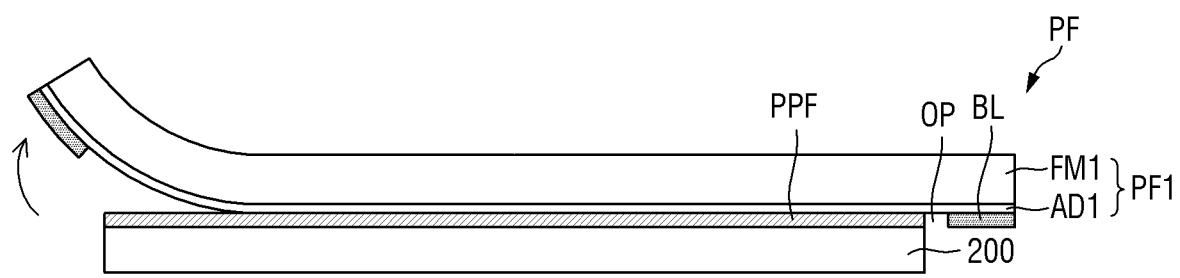
Figure 19:

Lastly, referring to FIGS. 18 and 19, the first protective film PF1 of the panel protective film PPF may be delaminated. By delaminating the first protective film PF1, the surface of the panel protective film PPF may be exposed.

During a process of delaminating the second protective film PF2 and the first protective film PF1 of the protective film PF, the first adhesive layer AD1 of the first protective film PF1 and the second adhesive layer AD2 of the second protective film PF2 may be not exposed. Accordingly, it is possible to prevent the adhesive material from remaining on the display panel 300 or the touch sensing device 200, so that the display panel 300 or the touch sensing device 200 are not contaminated.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A protective film comprising:
   a panel protective film;
   a first protective film disposed on a surface of the panel protective film and covering the surface of the panel protective film, the first protective film having a surface and an opposite surface facing the panel protective film; and
   a second protective film disposed on an opposite surface of the panel protective film and covering the opposite surface of the panel protective film, the second protective film having a surface facing the panel protective film and an opposite surface opposed to the surface of the second protective film, wherein
   the first protective film comprises:
      a first film layer;
      a first adhesive layer disposed on the opposite surface of the first film layer; and
      a blocking layer disposed on an opposite surface of the first adhesive layer along an edge of the first adhesive layer,
   the second protective film comprises:
      a second film layer; and
      a second adhesive layer disposed on the surface of the second film layer,
   the blocking layer is spaced apart from the panel protective film and is coplanar with the panel protective film, and
   the blocking layer comprises:
      a first region overlapping the second adhesive layer in a plan view; and
      a second region located outside the first region and not overlapping the second adhesive layer in the plan view.

2. The protective film of claim 1, wherein
   the first adhesive layer and the first film layer completely overlap each other in a plan view, and
   the second adhesive layer and the second film layer completely overlap each other in a plan view.

3. The protective film of claim 2, wherein a width of the first protective film is greater than a width of the panel protective film by about 3.6 mm to about 4.4 mm.

4. The protective film of claim 1, wherein an outer side surface of the blocking layer is aligned with an outer side surface of the first adhesive layer.

5. The protective film of claim 4, wherein a width of the blocking layer in a range of about 1.8 mm to about 2.2 mm.

6. The protective film of claim 5, wherein a thickness of the blocking layer in a range of about 25 μm to about 27 μm.

7. The protective film of claim 1, wherein an inner side surface of the blocking layer is disposed further to an outside than an outer side surface of the panel protective film and disposed further to an inside than an outer side surface of the second adhesive layer.

8. The protective film of claim 7, wherein the blocking layer comprises:
a third adhesive layer disposed on the first adhesive layer; and
a blocking pattern disposed on the third adhesive layer.

9. The protective film of claim 8, wherein a thickness of the blocking pattern is in a range of about 10 μm to about 20 μm.

10. The protective film of claim 9, wherein a thickness of the third adhesive layer is in a range of from about 5 μm to about 7 μm.

11. The protective film of claim 8, wherein the third adhesive layer has an adhesive strength of about 100 gf/inch or more.

12. The protective film of claim 8, wherein the third adhesive layer includes at least one of an acrylic adhesive, a silicone adhesive, and a urethane adhesive.

13. The protective film of claim 1, wherein each of the first protective film and the second protective film is a stack selected from at least one of polyethylene terephthalate (PET), polycarbonate (PC), polyvinyl chloride (PVC), and polyolefin film.

14. The protective film of claim 1, wherein a thickness of the panel protective film is greater than a thickness of the blocking layer.

15. The protective film of claim 14, wherein the thickness of the panel protective film is in a range of about 25 μm to about 35 μm.

16. The protective film of claim 15, wherein a thickness of the blocking layer is in a range of about 25 μm to about 27 μm.

17. The protective film of claim 16, wherein
the blocking layer comprises a third adhesive layer disposed on the first adhesive layer and a blocking pattern disposed on the third adhesive layer, and
the third adhesive layer has a thickness in a range of about 5 μm to about 7 μm.

18. The protective film of claim 1, wherein a thickness of the first protective film is substantially equal to a thickness of the second protective film.

19. The protective film of claim 1, wherein the blocking layer comprises a plurality of blocking segments separated from one another with an opening disposed between adjacent ones of the plurality of blocking segments.

20. A method for fabricating a display device, the method comprising:
providing a protective film;
providing a display panel;
removing a second protective film of a protective film and placing the protective film such that an exposed panel protective film is placed on a surface of the display panel; and
removing a first protective film, wherein
the protective film comprises:
the panel protective film;
the first protective film disposed on a surface of the panel protective film and covering the surface of the panel protective film, the first protective film having a surface and an opposite surface facing the panel protective film; and
the second protective film disposed on an opposite surface of the panel protective film and covering the opposite surface of the panel protective film, the second protective film having a surface facing the panel protective film and an opposite surface opposed to the surface of the second protective film,
the first protective film comprises:
a first film layer;
a first adhesive layer disposed on the opposite surface of the first film layer; and
a blocking layer disposed on an opposite surface of the first adhesive layer along an edge of the first adhesive layer,
the second protective film comprises:
a second film layer; and
a second adhesive layer disposed on a surface of the second film layer,
the blocking layer is spaced apart from the panel protective film, and is coplanar with the panel protective film, and
the blocking layer comprises:
a first region overlapping the second adhesive layer in a plan view, and
a second region located outside the first region and not overlapping the second adhesive layer in the plan view.

* * * * *